United States Patent [19]

Cima et al.

[11] Patent Number: 5,231,074
[45] Date of Patent: Jul. 27, 1993

[54] PREPARATION OF HIGHLY TEXTURED OXIDE SUPERCONDUCTING FILMS FROM MOD PRECURSOR SOLUTIONS

[75] Inventors: Michael J. Cima, Lexington; Paul McIntyre, Cambridge, both of Mass.

[73] Assignee: Massachusetts Institute of Technology, Cambridge, Mass.

[21] Appl. No.: 510,115

[22] Filed: Apr. 17, 1990

[51] Int. Cl.$^5$ .......................... B05D 3/02; B05D 5/12
[52] U.S. Cl. ...................... 505/1; 505/734; 427/62; 427/226
[58] Field of Search .................. 505/1, 734; 427/62, 427/63, 226, 126.3

[56] References Cited

U.S. PATENT DOCUMENTS 4,880,770  11/1989  Mir et al. ................................ 505/1

FOREIGN PATENT DOCUMENTS 63-66859  3/1988  Japan.
64-19624  1/1989  Japan.
64-38913  2/1989  Japan.
1-138129  5/1989  Japan.
1-313332  12/1989  Japan.

OTHER PUBLICATIONS

Mantese et al, "Metalorganic Deposition (MOD): A Nonvacuum Spin-On, Liquid-Based, Thin Film Method" MRS Bulletin Oct. 1989 pp. 48-53.

Hamdi et al, "Formation of Thin-Film High Tc Superconductors by Metalorganic Deposition", Appl. Phys. Lett. 51(25) Dec. 1987 pp. 2152-2154.

Komatsu et al, "On the New Substrate Materials for High-Tc Superconducting Barrium Yttrium Copper Oxide Thin Films" Jpn. J. Appl. Phys. 27(9) Sep. 1988 L1686-1689.

Rice et al, "Preparation of Superconducting Thin Films of $Ba_2YCu_3O_7$ by a Novel Spin-On Pyrolysis Technique", Appl. Phys. Lett. 51(22) Nov. 1987 pp. 1842-1844.

"Superconducting oxide films with high transition temperature prepared from metal trifluoroacetate precuroses", A. Gupta et al., Applied Physics Letters, 52, p. 2077 (1988).

"Preparation of Superconducting Oxide Films from Metal Trifluoroacetate Solution Precursors", A. Gupta et al., Chemistry of High-Temperature Superconductors II, eds. D. L. Nelson and T. F. George, American Chemical Society pp. 265-279 (1988).

"Superconducting Bi-Sr-Ca-Cu-O Films Prepared From Metal Trifluoroacetate Precursors", A. Gupta et al., Physica C, 158, p. 225 (1989).

"Production of superconducting thick films by a spin-on process", P. May et al., Superconductor Science & Technology, 1, pp. 1-4 (1988).

"Metallo-Organic Decomposition for Superconductive $YBa_2Cu_3O_{7-x}$ Film", Kien F. Teng et al., IEEE Transactions On Components, Hybrids, And Manufacturing Technology, 12, p. 96 (Mar. 1989).

"Superconducting Thin Films Of High $T_c$ Cuprates Prepared By Spin-On/Pyrolysis", Rice et al., Topical Conference on Thin Film Processing and Characterization of High-Temperature Superconductors, pp. 198-203, Nov. 6, 1987, (1988).

(List continued on next page.)

*Primary Examiner*—Shrive Beck
*Assistant Examiner*—Roy V. King
*Attorney, Agent, or Firm*—Choate, Hall & Stewart

[57] ABSTRACT

Highly-textured superconductor oxide thin films are prepared on substrates, including lattice matched, non-lattice matched, inert and non-inert materials, by metal organic deposition (MOD). Precursor solution composition, as well as processing temperature and atmosphere are selected to control the presence of a transient liquid phase. Superconductor oxide films characterized by highly textured morphologies and fully dense, homogeneous microstructures are capable of sustaining critical current densities in excess of $10^4$ A/cm$^2$ at 77° K. when prepared on non-lattice matched substrates or critical current densities in excess of $10^6$ A/cm$^2$ at 77° K. when prepared on lattice-matched substrates.

29 Claims, 8 Drawing Sheets

OTHER PUBLICATIONS

"Microstructure and superconducting properties of Y-Ba-Cu-O and Yb-Ba-Cu-O thin films formed by metalorganic deposition", Chen et al., Journal of Materials Research, 4, 1065 (1989), pp. 1065–1071.

"Spin-On Thin Films of $YBa_2Cu_3O_{7-y}$ and $La_{2-x}Sr_xCuO_{4-y}$ From Citrate-Polymer Precursors", Chiang et al., Materials Research Society Symposium Proceedings, 99, 307 (1988), pp. 307–310.

"Versatile new metalorganic process for preparing superconducting thin films", Gross et al., Applied Physics Letters, 52, 160 (1988), pp. 160–162.

"Microstructure of $YBa_2Cu_3O_{7-x}$ thim films grown on single-crystal $SrTiO_3$", Chan et al., Journal of Applied Physics, 65, (12) (1989), pp. 4719–4722.

"Reproducible technique for fabrication of thin films of high transition temperature superconductors", Mankiewich et al., Applied Physics Letters, 51, p. 1753 (1987).

"Preparation of Superconducting $YBa_2Cu_3O_{7-\delta}$ Thin Films by the Dipping-Pyrolysis Process Using Organic Acid Salts", Kumagai et al., Chemistry Letters, No. 8, pp. 1645–1646, (1987).

"Superconducting Films In The Y-Ba-Cu-O System Made By Thermal Decomposition Of Metal Carboxylates", M. Klee et al., Journal of Crystal Growth, 91 p. 346 (1988).

PREPARATION OF HIGHLY TEXTURED OXIDE SUPERCONDUCTING FILMS FROM MOD PRECURSOR SOLUTIONS

The Government has rights in this invention pursuant to contract Number MDA972-88-K0006 awarded by the U.S. Defense Advance Research Project Agency.

BACKGROUND OF THE INVENTION

The invention relates to fabrication of thin film oxide superconductors.

Metal organic deposition (MOD) is a method for fabrication of uniform thickness thin films from liquid precursor solutions as described by Y. L. Chen et al., J. Mater. Res., 4, 1065 (1989). Commonly, metal carboxylates dissolved in organic solvents are deposited on polished substrates by dipping or spin coating with a photoresist spinner. The green precursor films produced by this coating process are transformed into superconductor films by selective heat treatment which often involves multiple distinct calcination steps. Metal organic deposition techniques can be used to deposit films of uniform and controlled composition rapidly and without a need for sophisticated vacuum systems, J. V. Mantese et al., MRS Bull., 14, 48 (1989).

Several investigators have reported preparation of $Ba_2YCu_3O_{7-x}$ (BYC) thin films using metal organic deposition including, Y-M. Chiang et al., Mat. Res. Soc. Symp. Proc., 99, 307 (1988); M. E. Gross et al., Appl. Phys. Lett., 52, 160 (1988); T. Kumagai et al., Chem. Lett., 1645 (1987); M. Klee et al., J. Crys. Growth, 91, 346, (1988). However, these workers observe that the electrical transport properties of metal organic deposited BYC films prepared from metal carboxylate precursors are generally inferior to sputtered, co-evaporated and laser ablated films such as those prepared by R. L. Burton et al., submitted to SERI conference, Colorado Springs, Colo., November, 1988; S-W. Chan et al., J. Appl. Phys., 65, 4720 (1989); and P. M. Mankiewich et al., Appl. Phys. Lett., 51, 1753 (1987). Residual precursor materials trapped in MOD films may be responsible for these inferior properties; however, the high processing temperatures needed to completely eliminate precursor residues can cause undesirable reactions between the superconductor film and substrate.

SUMMARY OF THE INVENTION

According to the invention, a superconducting oxide thin film is fabricated by preparing a precursor solution containing film cation constituents in a stoichiometry nearly equal to that of the final oxide film product. The phrase "nearly equal" denotes a stoichiometry deviation from that of the final superconducting oxide film which can occur when constituents volatilize during processing. A coating of the precursor solution is applied to a substrate and exposed to a heat treatment and atmosphere selected to control the presence of a transient liquid phase during the firing process which yields the superconducting oxide film.

In preferred embodiments, the precursor solution may contain organic compounds such as metal trifluoroacetates and methyl alcohol. The precursor solution can be applied to the substrate by spinning, spraying, or painting or by dipping the substrate in the precursor solution. Superconductor oxide films can be fabricated on substrates having varied geometry including flat and three dimensional substrates including ribbon, wire or coil geometries. Substrates can be single crystals lattice matched to the final superconductor such as (001) $SrTiO_3$, (001) $LaAlO_3$, (001) $LaGaO_3$ and (001) $NdGaO_3$ or can be non-lattice matched compounds such as $BaZrO_3$, barium aluminum spinel and Ag-coated substrates. Ag-coated substrates can include metals such as silver, ceramics, or composites. The method is equally applicable for substrates chemically inert or reactive with respect to the superconductor film.

When a substrate reacts with the resultant superconductor film, the atmosphere and heat treatment can be selected to avoid the presence of a small amount of transient liquid phase thus avoiding reaction between the superconductor film and the substrate. Alternatively, when the substrate is not chemically reactive, the heat treatment and atmosphere can be selected to ensure that the actual amount of liquid phase is small, but of sufficient quantity to increase the grain growth rate to a rate adequate for creation of desired crystallographic texture. Multiple coatings can be made using fluorine containing precursor solutions and intermediate firings to produce mixed fluoride films sufficiently inert to withstand attack by an acid precursor solution.

The presence of a transient liquid phase during firing is encouraged by selection of processing atmosphere and temperature according to a phase diagram which includes the superconductor as well as all chemical constituents of the system. Temperature and oxygen partial pressure are chosen so that a liquid forms at points on the phase diagram corresponding to the compositions of local inhomogeneities in the coating, while, however, no liquid phase having a composition corresponding to the overall stoichiometry of the coating exists under these conditions, ensuring that the liquid phase is transient. Alternatively, atmosphere and temperature can be selected to avoid liquid containing phase fields between points in the phase diagram corresponding to compositions of the local inhomogeneities, thus ensuring that no liquid forms. The heat treatment consists of four steps. A first heating to a first temperature in a first controlled atmosphere decomposes the precursor coating while avoiding the volatilization of any precursor constituents. A second heating at a second temperature in a second controlled atmosphere creates compositional inhomogeneities in the coating. Processing at a third temperature in a third controlled atmosphere carefully selected to control the extent to which a small amount of transient liquid is present forms a compositionally homogeneous film. The final heat treatment occurs at low temperature and high $PO_2$ and ensures that the film is fully oxygenated. The first atmosphere can be moist oxygen, the second a moist reducing gas mixture, and the third dry oxygen depending upon the phase diagram of the system.

In one aspect of the invention, a $Ba_2YCu_3O_{7-x}$ film is deposited on a (001) or (100) and preferably (100) $SrTiO_3$ substrate from an organic solution containing metal trifluoroacetates prepared from powders of $BaCO_3$, $YCO_3 \cdot 3H_2O$ and $Cu(OH)_2CO_3$ combined and reacted in a 2:1:3 ratio with between 20-30% (5.5-6.0M) excess trifluoroacetic acid in methyl alcohol followed by refluxing for approximately four hours to produce a solution substantially 0.94M based on copper content. This precursor solution is applied to a polished (001) or (100) and preferably (100) $SrTiO_3$ substrate with a photoresist spinner operating at a speed in the range of approximately 3000–5000 rpm for a 0.25"×0.25" substrate. Spin coating parameters can be adjusted to accommodate substrates of varying dimensions. The precursor coating is heated slowly at a rate approximately in the range of 0.5° to 1.0 °C./min in moist oxygen having a dew point approximately in the range of 20° C. to 75° C. to a temperature approximately in the range 300°–500° C. After this heating step is complete, the coating is heated again for approximately one hour in a moist reducing nitrogen-oxygen gas mixture having a composition approximately in the range of 0.5 to 5.0% oxygen at a temperature less than 810° C. Following this heat treatment, the coating is cooled from the specified temperature range in dry oxygen for approximately 8 or more hours at a temperature in the range 400° C. to 500° C.

In another aspect of the invention, a $Ba_2YCu_3O_{7-x}$ superconductor film is fabricated on a $BaZrO_3$ substrate. A metal trifluoroacetate precursor solution is mixed from powders of $BaCO_3$, $YCO_3$ $3H_2O$ and $Cu(OH)_2CO_3$ combined in an approximately 2:1:3 ratio and reacted with 25–30% excess trifluoroacetic acid in methyl alcohol and refluxed for approximately ten hours to produce a viscous solution. A coating of the precursor is applied to a polished $BaZrO_3$ substrate with a photoresist spinner at a speed approximately in the range of 3000–7500 rpm depending on substrate dimensions. The precursor coating is heated slowly, at a rate approximately in the range of 0.5 to 1.0° C./min in moist oxygen or nitrogen to a temperature in the range 300° to 500° C. Following this decomposition reaction, the coating is heated for one hour in moist oxygen or nitrogen or oxygen-nitrogen mixture at a temperature less than 860° C. In a final heat treating step, the coating is brought to a temperature higher than the second temperature approximately in the range of 860°–950° C. for a time approximately in the range of 5–25 minutes. The coating is cooled from this temperature range in flowing dry oxygen to a temperature approximately in the range of 400°–500° C. for eight or more hours. The film is cooled to room temperature in static dry oxygen.

A superconductor film prepared according to the method of the invention is characterized by a thickness in the range 0.1–2.0 microns, depending upon the concentration of the precursor and the spin coating parameters and is characterized by highly textured morphology and fully dense microstructure. Such a film is capable of sustaining critical current densities greater than $10^4$ A/cm$^2$ for films on non-lattice matched substrates. In a preferred embodiment, the film has composition $Ba_2YCu_3O_{7-x}$.

The invention produces superior superconductor oxide thin films based on control of transient liquid phases during sintering. Superconducting oxide thin films having greatly enhanced texture with nearly equiaxed c-axis grains capable of supporting high current densities greater than $10^4$ A/cm$^2$ can be grown on non-lattice matched inert substrates. Sintering atmosphere and temperatures as well as precursor solution composition are controlled such that production of a transient liquid phase during the sintering process is encouraged resulting in enhanced grain growth.

During growth of superconductor films on lattice matched substrates, not chemically inert with respect to the superconductor film, production of a transient liquid phase during sintering is undesirable since it speeds reaction between film and substrate. In this case, the film composition along with sintering atmosphere and temperatures are controlled to avoid formation of a transient liquid phase. If the substrate is also lattice matched to the superconductor oxide thin film, epitaxy contributes to production of a highly textured superconductor oxide film.

DESCRIPTION OF THE PREFERRED EMBODIMENTS

The preferred embodiments of the invention are described by way of the following examples which illustrate how according to the invention, superconductor thin films can be prepared on substrates having different characteristics selectively chosen to suit a particular application. According to the invention, superconductor thin films can be fabricated on lattice matched non-inert substrates usch as $SrTiO_3$ or can be fabricated on non-lattice matched inert substrates such as $BaZrO_3$.

EXAMPLE 1

Textured films of $Ba_2YCu_3O_{7-x}$ can be grown on inert, non-lattice matched substrates such as $BaZrO_3$ by processing precursor films at temperatures between 850° C. and 920° C. C-axis texture is promoted by heat treatment and furnace atmosphere conditions which cause partial melting of Ba-Y-Cu-O compositions depleted in barium relative to $Ba_2YCu_3O_{7-x}$.

A metal trifluoroacetate (TFA) precursor solution was produced by mixing powders of $BaCO_3$, $Y_2CO_3 \cdot 3H_2O$, and $Cu_2(OH)_2CO_3$ in a 2:1:3 molar ratio and reacting them with 25% excess trifluoroacetic acid in the presence of methanol. The resulting solution was refluxed for approximately 10 h to react the starting materials completely and to concentrate the solution to a viscosity adquate for spin-coating. The solution was then centrifuged to extract any lint or other foreign particles present. Single coatings of precursor solution were spun onto $BaZrO_3$ 1-2 cm diameter substrates which had been prepared by slip-casting and firing to 1700° C. for 6 h, resulting 95% approximate density as measured by water displacement. Fired substrates were ground flat and polished to a 0.25 micron diamond finish and subsequently etched for 15 min in 10% hydrofluoric acid (HF) prior to coating.

Figure 1:
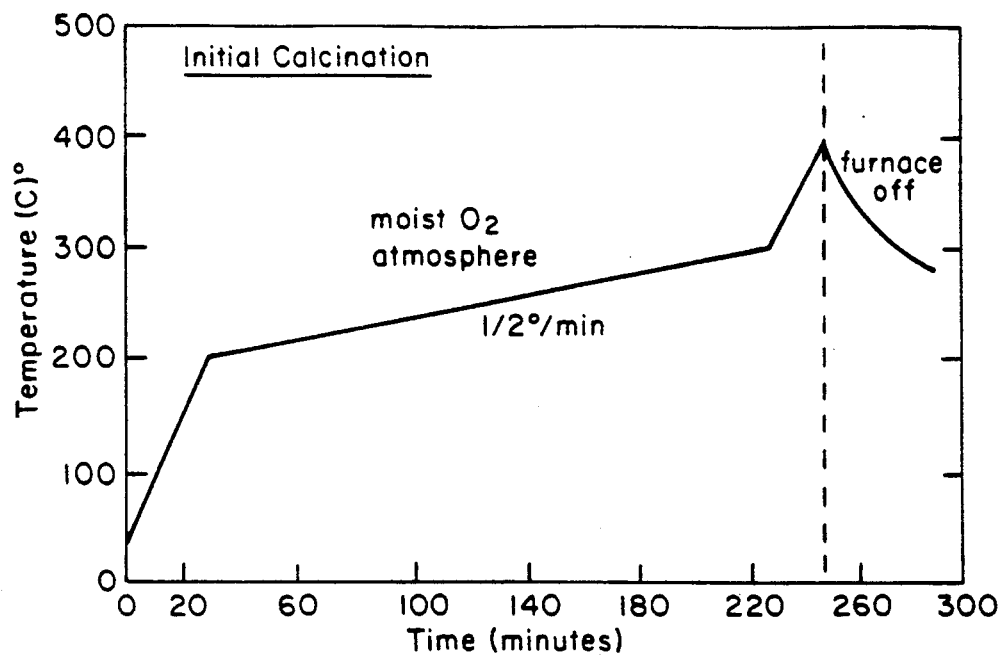
FIG. 1 is a temperature profile for initial calcination of a precursor coating.
Figure 2:
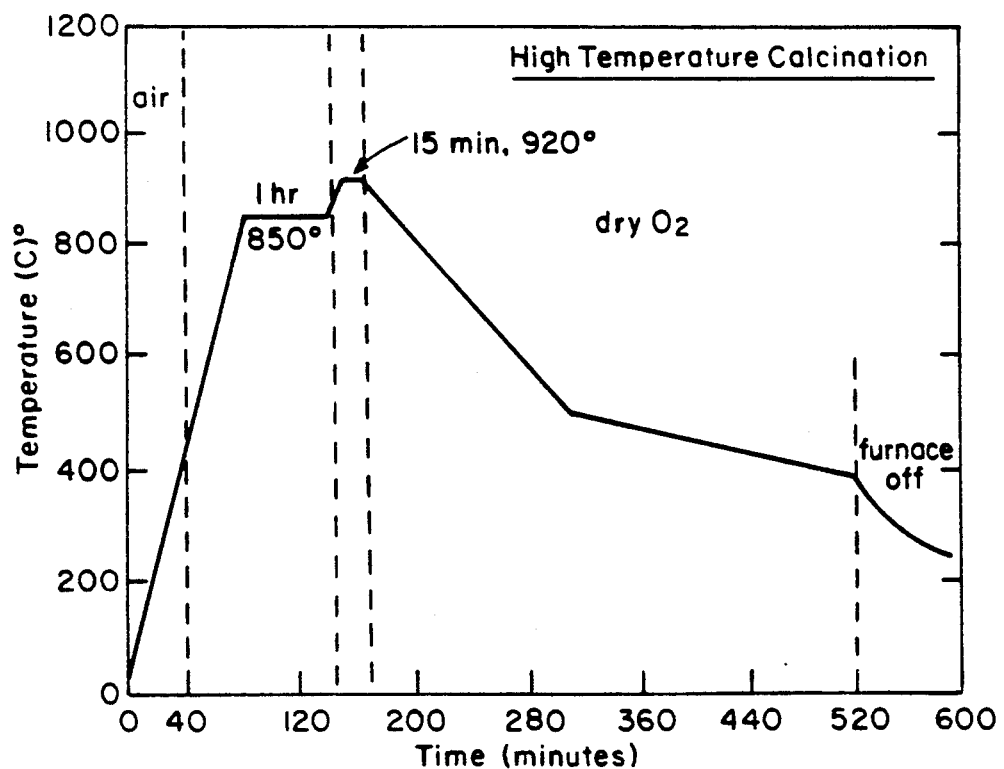
FIG. 2 is a temperature profile for final calcination of the precursor coating to form the superconducting $Ba_2YCu_3O_{7-x}$ film.

Green TFA films were calcined in two stages. A temperature profile for an initial calcination is shown in FIG. 1. In this calcination, the TFA precursor films were decomposed to mixed fluorides during slow heating (at a rate of 10° C./min) to 400° C. in a moist oxygen atmosphere. The temperature profile for a typical final high temperature calcination is represented in FIG. 2. Flow of a moist nitrogen furnace atmosphere was initiated at 400° C. Films were heated in a moist atmosphere to 850° C. at 10° C./min, and then held at 850° C. for one hour. Following the one hour 850° C. hold, the furnace atmosphere was switched from moist to dry nitrogen, and the films were heated at 10° C./min to 920° C. for a 15 min anneal. The films were slow cooled in dynamic dry oxygen to 400° C. following the annealing step. At 400° C., the furnace was shut down and the films cooled to room temperature in a static oxygen atmosphere. All heat treatments were carried out in a CM 2200 quartz tube furnace. Moist furnace atmospheres were produced by bubbling the gas through an attached reservoir of deionized water prior to flowing through the furnace. The temperature of the reservoir was varied to control the partial pressure of water inside the furnace.

Phase development during calcination of the precursor was observed by TGA (Perkin Elmer TGA 7) and by x-ray diffraction with $Cu(K_a)$ radiation (Rigaku RU300 diffractometer). The microstructure of the fired BYC films was observed and characterized by scanning electron microscopy (SEM) (Hitachi S-530) and by x-ray pole figures (Rigaku RU200). Changes in film composition were characterized by Auger spectroscopy (Perkin Elmer 660 scanning Auger multiprobe), diffuse infrared Fourier transform spectroscopy (DRIFTS), and energy dispersive analysis by x-ray (EDAX). Electrical properties were determined directly by four-point DC current-voltage measurements. Wilver electrodes were deposited on the fired films by evaporation in a Denton DV-502A vacuum chamber. Following deposition of the electrodes, the films were annealed at 450° C. for 2 h in oxygen to reoxygenate the material. Copper leads were joined to the electrodes with indium solder.

During the ramp from room temperature to 200° C., solvent was removed from the green precursor films. The films were heated very slowly from 200° C. to 300° C. to increase the duration of the TFA-fluoride decomposition which occurs over this temperature range. Faster heating rates (greater than 1° C./min) lead to the development of large cracks in the calcined films. A moist oxygen atmosphere was used in the low temperature calcination to prevent the loss of copper during heating of mixed TFA films in dry furnace atmospheres. Films prepared from TFA solutions and calcined to 400° C. in dry oxygen were transparent and, after subsequent high temperature treatments, showed no sign of BYC by x-ray diffraction. Examination of the composition of these films using EDAX indicated a complete absence of copper. Copper depletion was not observed when the low temperature calcination was performed under a moist oxygen atmosphere.

Figure 3A:
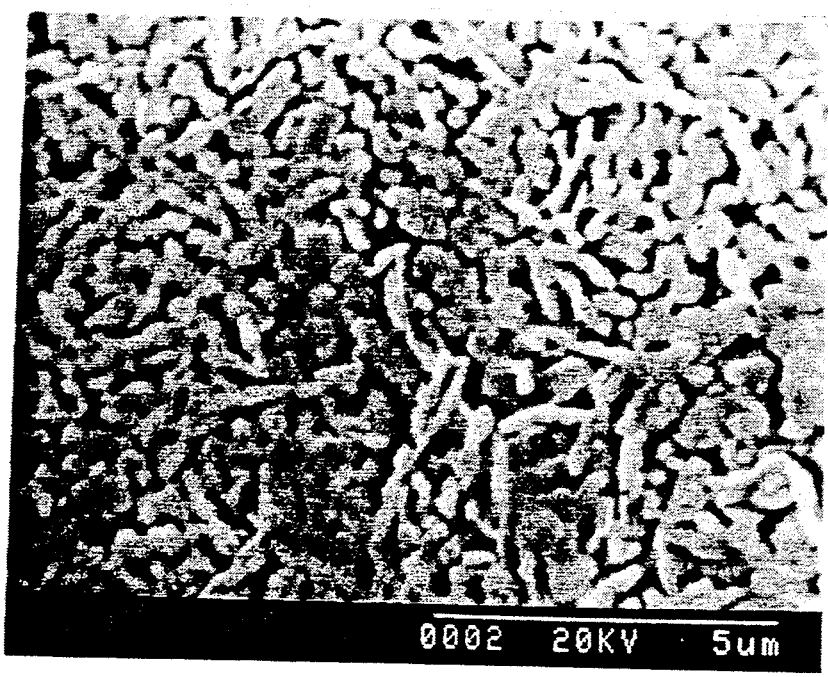
FIGS. 3(a) and 3(b) are SEM photomicrographs of (a) a film fired in moist oxygen at 850° C. and then annealed in dry nitrogen at 920° C. prior to cooling in oxygen and (b) a film fired in moist nitrogen above 800° C. and then annealed in dry nitrogen at 920° C. prior to cooling in oxygen.
Figure 3B:
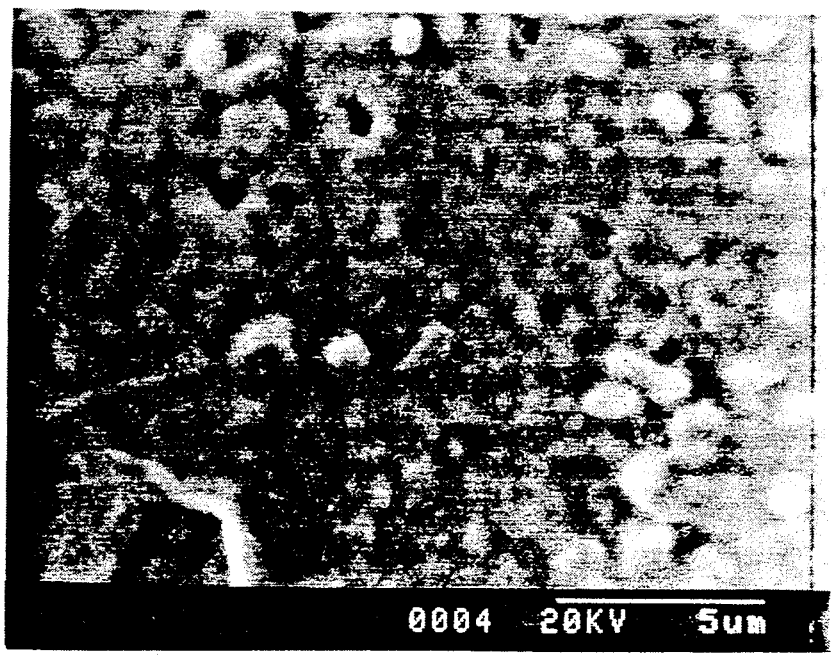
Figure 6:
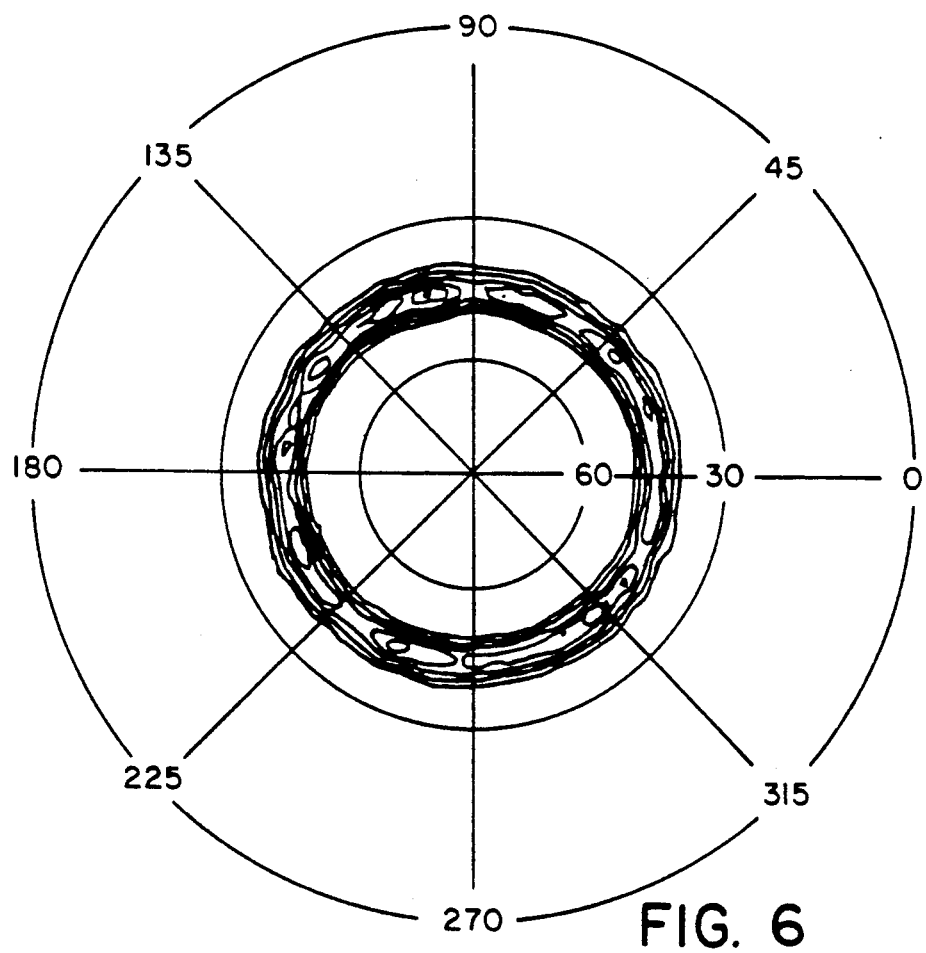
FIG. 6 is an x-ray pole figure of a film fired in moist nitrogen for one hour at 850° C. and then annealed in dry nitrogen for fifteen minutes at 920° C. and cooled in dry oxygen.
Figure 7:
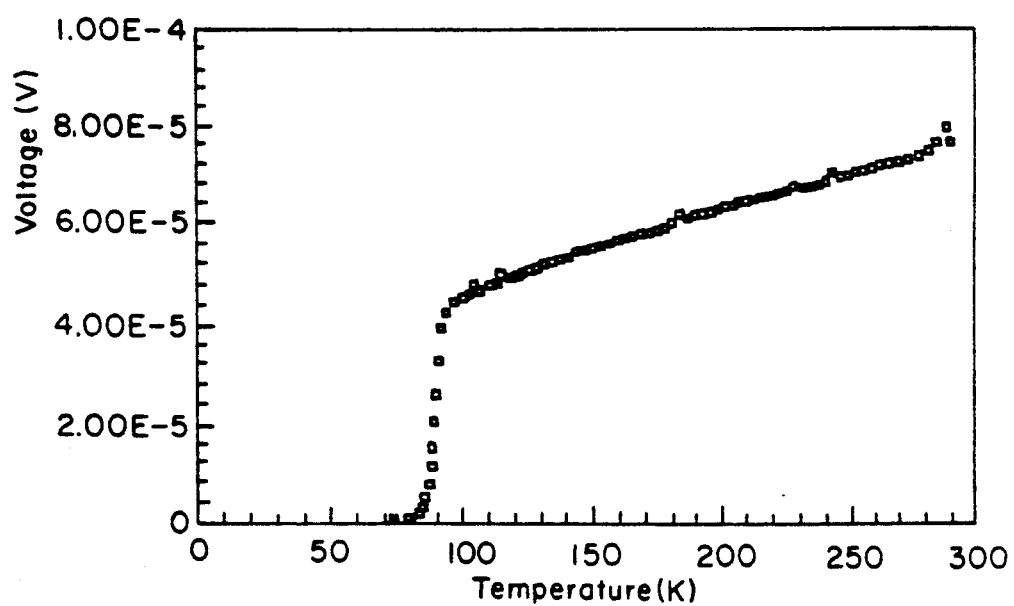
FIG. 7 is a graph showing the voltage vs. temperature behavior of a film fired in moist nitrogen for one hour at 850° C. and then annealed in dry nitrogen for fifteen minutes at 920° C. and cooled in dry oxygen.

The furnace atmosphere was found to have a significant effect on the final film morphology and properties. When a moist oxygen atmosphere was used during the high temperature calcination, a microstructure consisting of randomly-oriented BYC platelets resulted and did not appear to change significantly during the hold at 850° C. or during the subsequent anneal at 920° C. Referring to FIG. 3(a), the platelet morphology had substantial open porosity, and the electrical transport properties of these films were poor with no superconducting transition observed. x-ray powder diffraction indicated no preferred orientation of the BYC crystallites in these films. Films calcined above 800° C. in moist nitrogen, however, were dense, c-axis textured, and had improved electrical transport properties. The photomicrograph in FIG. 3(b) shows the rather featureless appearance of these films; there is an absence of porosity other than flaws associated with surface pores in the $BaZrO_3$ substrates. The x-ray powder diffraction pattern and x-ray pole figure for the pictured film (FIGS. 4, 5 and 6) indicate a high degree of c-axis preferred orientation. The voltage-temperature behavior of this film is shown in FIG. 7. In contrast to the films fired in moist oxygen, metallic behavior was observed before the transition, which was fairly sharp ($T_c$(onset)=90° K. $T_c(0)$=80° K.). The observed $J_c$(4.2° K.) values for films given this heat treatment (850° C.: 1 h, $N_2$/ $H_2O$ 920° C.: 15 min, $N_2$) were approximately 2000 $A/cm^2$. Measured room temperature resistivities for these films were less than $10^{-3}$ ohm-cm.

Figure 4:
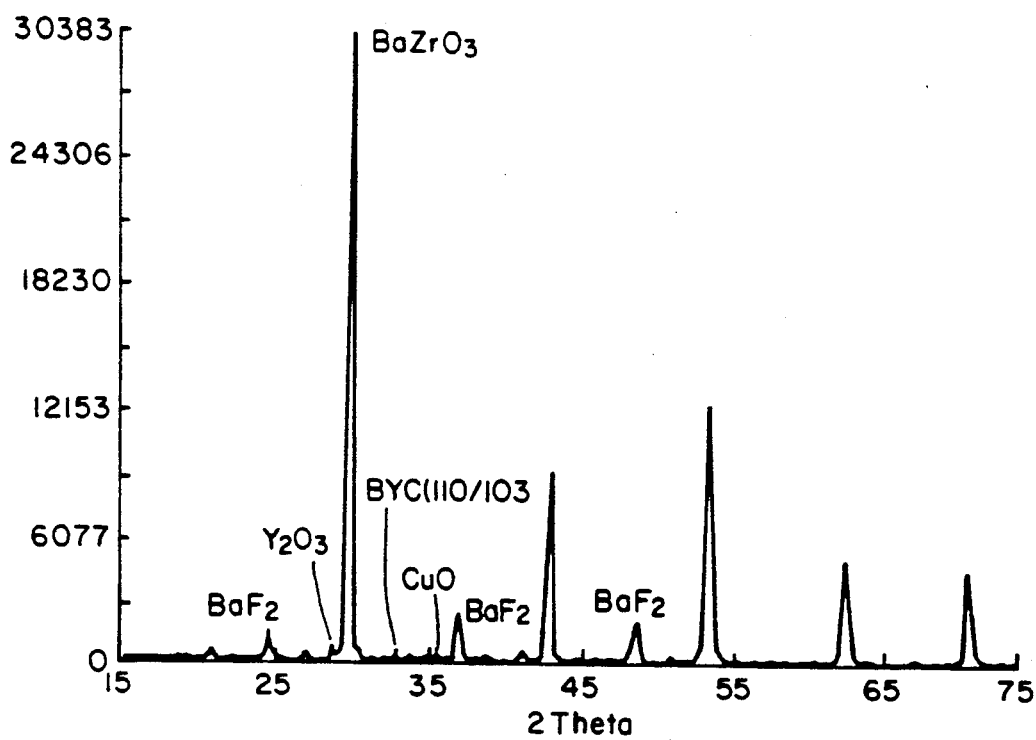
FIG. 4 is an x-ray powder diffraction pattern of a film fired in 20° C. dew point nitrogen heated to 850° C. and then cooled in dry oxygen.
Figure 5:
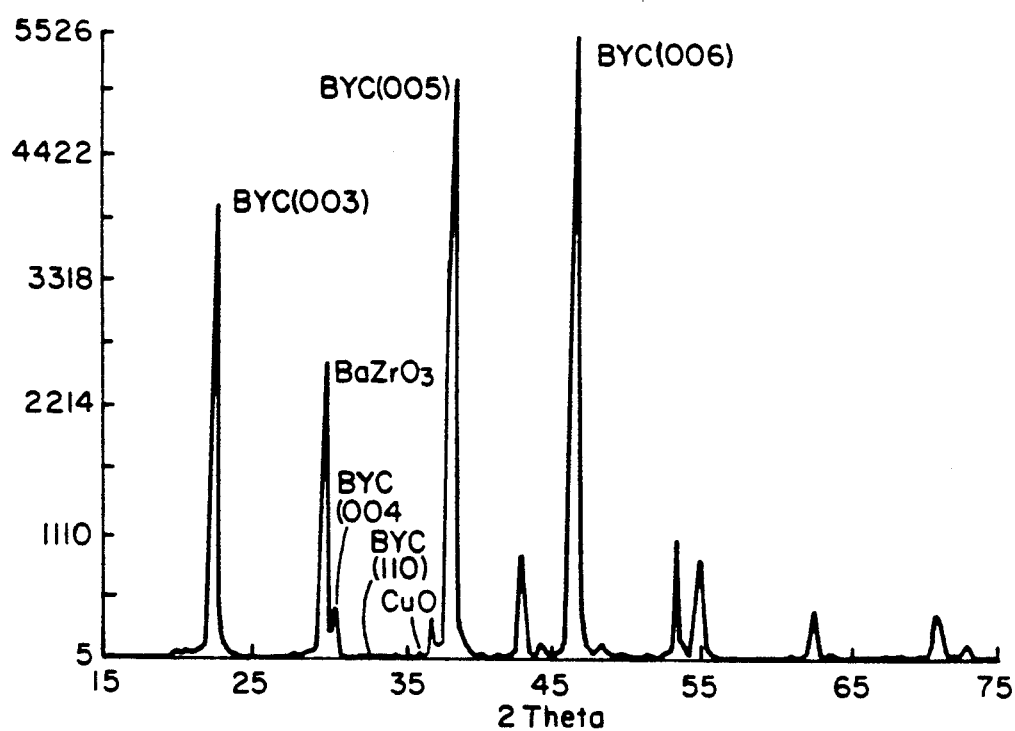
FIG. 5 is an x-ray powder diffraction pattern of a film heated to 850° C. in moist nitrogen and then annealed in dry nitrogen at 920° C. for fifteen minutes and cooled in oxygen.

The effect of the heat treatment on texture development is shown in FIG. 4 and 5. The degree of c-axis texture can be assessed qualitatively by comparing the intensity of the (00 l) reflections to that of the (110) peak, which is the strongest reflection for a randomly-oriented sample of $Ba_2YCu_3O_{7-x}$. The x-ray powder diffraction pattern in FIG. 3 represents the case of a TFA-derived film that was heated to 850° C. in moist (20° C. dew point) nitrogen and then immediately cooled in dry oxygen. The presence of reflections associated with $BaF_2$, $Y_2O_3$, and CuO indicate that fluoride decomposition was not yet complete, and BYC phase formation was just beginning when 850° C. was reached. FIG. 5 shows the effect of adding a 15 minute anneal at 920° C. in nitrogen to the heat treatment described above. In this case, significant BYC formation took place and much of the phase appeared to have a preferred c-axis orientation. Comparison of BYC peak intensities indicated that texture development occurred during the nitrogen anneal at 920° C., but it was limited due to the fact that a large fraction of the barium remained as BaF$_2$ and was not available to form Ba$_2$YCu$_3$O$_{7-x}$. In films that were held at 850° C. in 20° C. dew point nitrogen for 1 hour and then cooled in oxygen, no BaF$_2$ can be detected and fairly broad peaks corresponding to the (003), (005), and (006) BYC reflections are visible in the diffraction pattern indicating some c-axis texture. In addition, the Y$_2$O, Y$_2$Cu$_2$O$_5$, and CuO reflections demonstrate that regions of the films were barium-depleted after firing at 850° C. for 1 hour. The addition of a 15 minute 920° C. anneal in nitrogen to the 1 hour hold in moist nitrogen at 850° C. produced a dramatic increase in the degree of texture present in the films (FIG. 4). The "shoulder" on the low-angle side of the main BaZrO$_3$ reflection in the pattern suggests that Y$_2$O$_3$ was present, and this conclusion is supported by the existence of a low intensity CuO peak.

Figure 10:
FIG. 10 is an SEM photomicrograph of a 0.3 micron-thick barium yttrium copper oxide film fired in moist (75° C. dew point) $N_2/3.5\%$ $O_2$ for one hour at 750° C. on (100) $SrTiO_3$.

In addition to the heat treatments in 20° C. dew point nitrogen furnace gas, a number of films were fired in higher P$_{H2O}$ atmospheres by heating the water reservoir through which the gas bubbled. As in the lower moisture case, enhanced c-axis texture was observed in these heated-reservoir films following a 920° C. anneal in dry nitrogen (see FIGS. 10a and 10b). However, growth of c-axis textured BYC also took place when the furnace gas was switched to dry oxygen for the anneal, after the preceding 850° C. hold was performed in 75° C. dew point nitrogen. FIG. 6 represents an x-ray pole figure of a highly textured film produced using an oxygen anneal. In the low P$_{H2O}$ case, annealing in oxygen produced films with little or no texture and with platelet microstructure. A summary of heat treatments and their effect on the degree of c-axis orientation in the films is presented in Table I below.

TABLE I

Summary of Heat Treatments and C-axis Texture in TFA-derived Films.

| Hold gas (wet) | Hold time (h) | Dew Point (°C.) | Anneal gas | Texture | BaF$_2$ |
|---|---|---|---|---|---|
| O$_2$ | 3 | 75 | O$_2$ | None | no |
| O$_2$ | 1 | 75 | n.a. | None | no |
| O$_2$ | * | 75 | n.a. | None | no |
| N$_2$ | 3 | 75 | O$_2$ | Strong | no |
| N$_2$ | 1 | 75 | N$_2$ | Strong | no |
| N$_2$ | 1 | 75 | n.a. | Weak | no |
| N$_2$ | * | 75 | n.a. | Weak | no |
| N$_2$ | 1 | 20 | O$_2$ | None | no |
| N$_2$ | 3 | 20 | N$_2$ | Strong | no |
| N$_2$ | 1 | 20 | N$_2$ | Strong | no |
| N$_2$ | 1 | 20 | n.a. | Weak | no |
| N$_2$ | * | 20 | n.a. | None | yes |
| N$_2$ | * | 20 | N$_2$ | Moderate | yes |

*these films were heated to 850° in moist furnace atmospheres and then immediately cooled in dry O$_2$.

Figure 8:
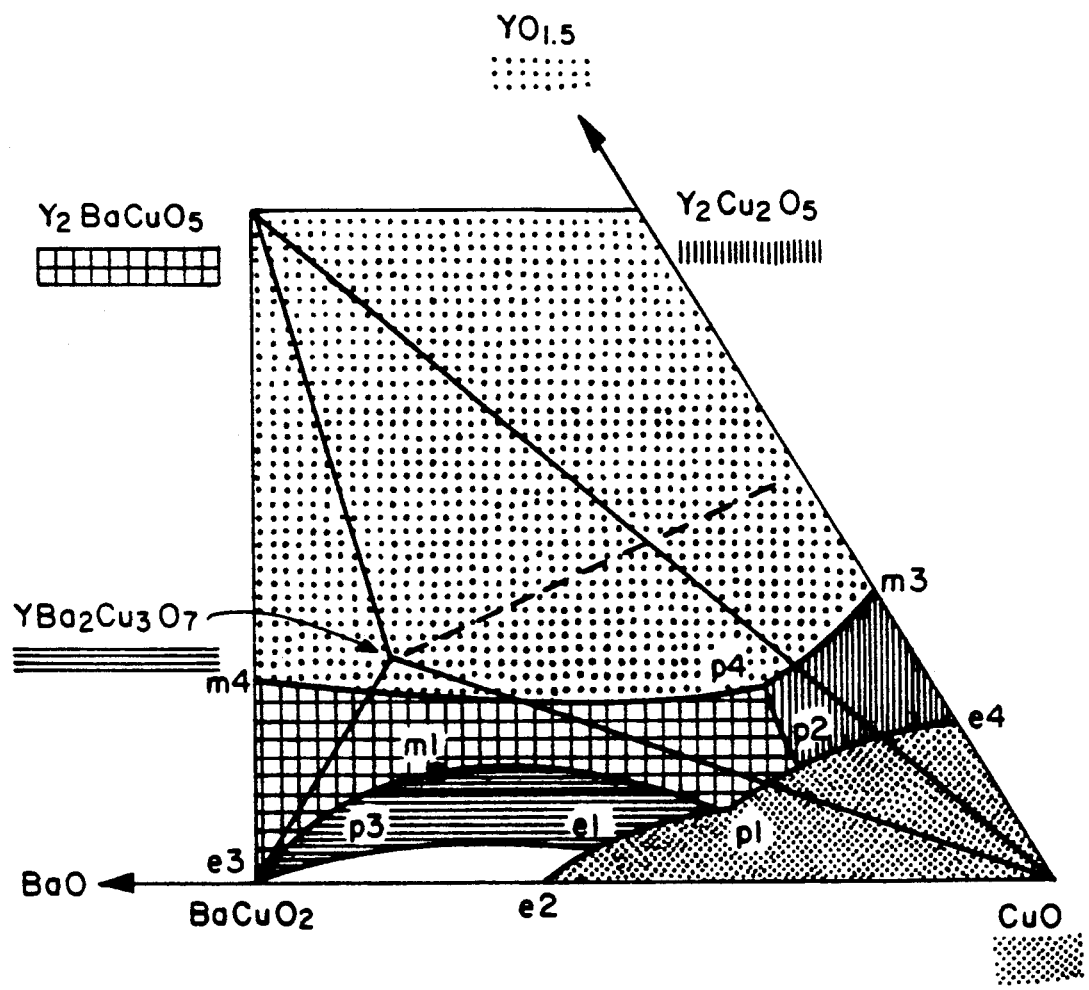
FIG. 8 is an illustration of the liquidus surface of the $YO_{1.5}$-BaO-CuO system showing the locus of compositions of films prepared according to the invention.

A schematic representation of the ternary system BaO-YO$_{1.5}$-CuO near CuO is shown in FIG. 8 (J. E. Ullman, R. W. McCallum et al., J. Mater. Res. 4, 752-754 (1989)) The locus of compositions investigated for partial melting is shown as the dashed line running from Ba$_2$YCu$_3$O$_{7-x}$ to the YO$_{1.5}$-CuO binary. A summary of the partial melting temperatures observed as a function of barium depletion and atmosphere is provided in Table II.

TABLE II

Observed DTA Melting Endotherm Onset Temperatures as a Function of Barium Content and Atmosphere.

| Mol % Ba Deficiency | DTA Melting Onset Temperatures (°C.) | |
|---|---|---|
| | O$_2$ Atmosphere | N$_2$/H$_2$O Atmosphere |
| 0 | 1010 | 955 |
| 5 | 957 | 859 |
| 10 | 964 | 861 |
| 20 | 960 | 855 |
| 40 | 960 | 860 |
| 60 | 963 | 864 |
| 80 | 988 | 863 |
| 100 | 1085 | 910–950 |

A moist nitrogen atmosphere was chosen to simulate the furnace atmosphere used during the high temperature calcination of the films produced in this study.

The introduction of moisture during both stages of calcination of the TFA-derived films had important consequences for film composition and microstructure development.

The removal of copper from the green films during low temperature calcination in a dry furnace atmosphere is attributed to the volatilization of Cu(TFA)$_2$. It is believed that hydrolysis of Cu(TFA)$_2$ to non-volatile Cu(TFA)(OH) took place when the initial calcination was performed in a moist furnace atmosphere.

In high temperature calcinations, water vapor in the furnace gas reacted with BaF$_2$, YF$_3$, and CuF$_2$ to form the mixed metal oxides and HF gas. The x-ray diffraction pattern in FIG. 4 indicates that yttrium and copper fluoride were completely converted to their respective oxides below 850° C. by reaction with water vapor. However, BaF$_2$ was present in the films up to 850° C. and beyond, depending upon the duration of the heat treatment in 20° C. dew point furnace gas. Changing the moist furnace gas from nitrogen to oxygen did not appear to affect the degree of BaF$_2$ removal. Heating the water reservoir to 75° C. caused the elimination of BaF$_2$ at furnace temperatures below 850° C. as observed by x-ray diffraction and Auger spectroscopy.

A DTA study indicates that partial melting of barium-deficient Ba-Y-Cu-O compositions may occur at temperatures as low as 860° C., which is within the temperature range used in firing the TFA-derived films. The stability of BaF$_2$ above 800° C. causes inhomogeneities in composition during high temperature calcination of the films. Before reaction of the fluorides with water vapor is complete, the films may consist of grains of BaF$_2$ in a barium-depleted matrix. The x-ray diffraction results in FIG. 5 indicate that localized barium depletion persisted after the BaF$_2$ had been completely decomposed. Presumably, elimination of local compositional variations is limited by the rates of interdiffusion of BaO and the barium-deficient material, and the rate of reaction of the oxides to form Ba$_2$YCu$_3$O$_{7-x}$. Evidently, the heat treatments used in this work did not fully eliminate local compositional variations, and regions of the films remained barium-deficient throughout the high temperature calcination. Therefore, the DTA results suggest that a liquid phase may form transiently in the TFA-derived BYC films during the annealing step at 920° C. in a reducing atmosphere.

The increase in c-axis preferred orientation observed when the films were annealed in nitrogen at 920° C. occurred under conditions in which DTA experiments suggest melting of the barium-depleted material should take place. This implies that texture development in this system may be linked to the presence of a liquid phase at high temperatures. The presence of a small amount of liquid phase during the firing of ceramic materials can assist in the formation of large grains through secondary recrystallization (W. D. Kingery et al., *Introduction to Ceramics;* (John Wiley & Sons, New York, N.Y., 1976), pp.461-465). A correlation between partial melting and texture development is consistent with the observation that a random microstructure formed when the TFA-derived films were fired in moist oxygen. The DTA experiments indicate that firing under oxidizing conditions will not promote melting of barium-depleted film material at the calcination temperatures used in this study.

Results obtained in DTA experiments do not seem to support the formation of a liquid phase when the 920° C. anneal is performed in oxygen. The random orientation of BYC platelets observed is consistent with DTA results. In that case, the film was held at 850° C. in 20° C. dew point nitrogen before being annealed in dry oxygen at 920° C. However, when films were exposed to 75° C. dew point nitrogen prior to the oxygen anneal, strong c-axis texture resulted. Clearly, the amount of water vapor present in the furnace has a significant effect on the degree of texture that is developed during the annealing step in these particular heat treatments. When oxygen flow began at the end of the 850° C. hold, there was an exchange time before the moist reducing atmosphere was fully replaced by dry oxygen. We believe that nitrogen and water vapor persisted in the furnace atmosphere to temperatures greater than 900° C. prior to the start of the anneal. The effect of a complex $N_2/H_2O/O_2$ atmosphere on the peritectic melting temperatures in the $BaO-YO_{1.5}-CuO$ ternary system can lead to formation of a small amount of liquid phase when the films are heated to 920° C., before oxygen becomes the dominant component in the furnace gas.

EXAMPLE II

A $Ba_2Cu_3O_{7-x}$ film was prepared on a (100) $SrTiO_3$ substrate by MOD of metal trifluoroacetate precursors. $SrTiO_3$ is lattice matched to $Ba_2YCu_3O_{7-x}$, but is not chemically inert with respect to this compound. A low temperature processing technique for growth of $Ba_2YCu_3O_{7-x}$ avoids the formation of a transient liquid phase which might react with the $SrTiO_3$ substrate, resulting in formation of undesirable reaction products. The reaction proceeds by the formation of the more stable barium titanium oxide and subsequent depletion of the film of barium and contamination of the film with strontium. Film texture development is encouraged through epitaxy.

A film was prepared by spin coating a (100) $SrTiO_3$ substrate with a precursor solution of the mixed Ba, Y, and Cu TFA salts in methanol. The TFA precursor solution was produced by mixing powders of $BaCo_3$, $Y_2CO_3 \cdot 3H_2O$, and $Cu_2(OH)_2CO_3$ in a 2:1:3 ratio and reacting them with 25% excess trifluoroacetic acid in methyl alcohol. The mixed solution was refluxed for 4 h to completely react the starting materials. Single coatings of this approximately 0.94M based on Cu concentration solution were applied to polished (100) $SrTiO_3$ single crystal substrates (0.25 in × 0.25 in × 0.02 in) with a photoresist spinner operating at 4000 rpm.

The film was fired in two stages. The first stage was a slow calcination (0.5° C./min) in moist (20° C. dew point) oxygen to 400° C. The resulting oxyfluoride film was transparent and appeared to be uniform in thickness. The second stage of the heat treatment was a 1 hour hold in moist (75° C. dew point) nitrogen/3.5% oxygen at 750° C. Oxygen was added to the reducing gas mixture to insure stability of the tetragonal BYC phase at high temperature. High $P_{H_2O}$ was required to convert $BaF_2$ to the oxide at 750° C. (rather than at 850° C. as in previous runs). Lowering the hold temperature from 850° C. to 750° C. prevented film/substrate reactions that had been observed in earlier films fired on $SrTiO_3$ in reducing conditions. The film was cooled from 750° C. in dry oxygen with an eight hour hold at 450° C. All heat treatments were carried out in a CM 2200 quartz tube furnace. Moist furnace atmospheres were produced by bubbling the gas through an attached heated reservoir of deionized water prior to flowing through the furnace.

Figure 9:
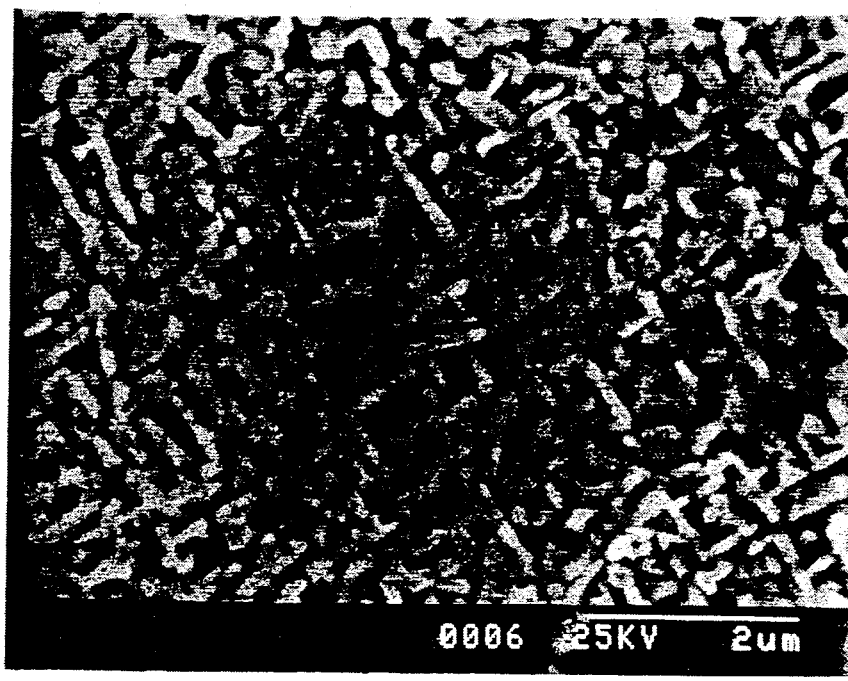
FIG. 9 is an SEM photomicrograph of a 0.4 micron-thick barium yttrium copper oxide film fired in moist oxygen at 850° C. for one hour. Substrate was (100) $SrTiO_3$.
Figure 11:
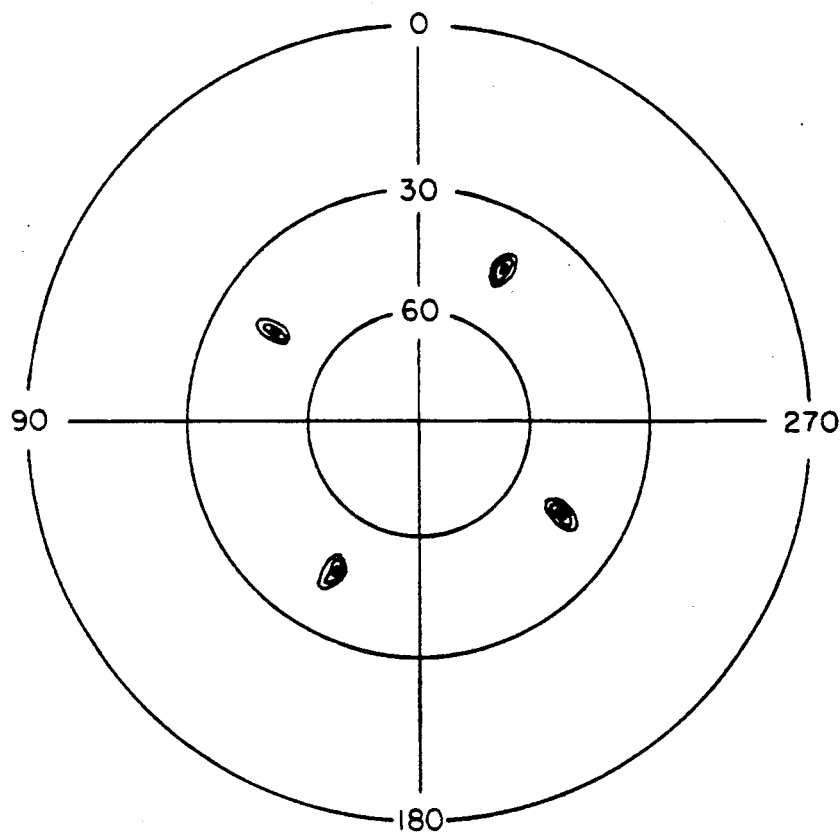
FIG. 11 is an x-ray pole figure for the (103) barium yttrium copper oxide plane from a TFA-derived 0.3 micron-thick film fired in moist (75° C. dewpoint) $N_2/3.5\%$ $O_2$ for one hour at 750° C. (100) $SrTiO_3$.
Figure 13:
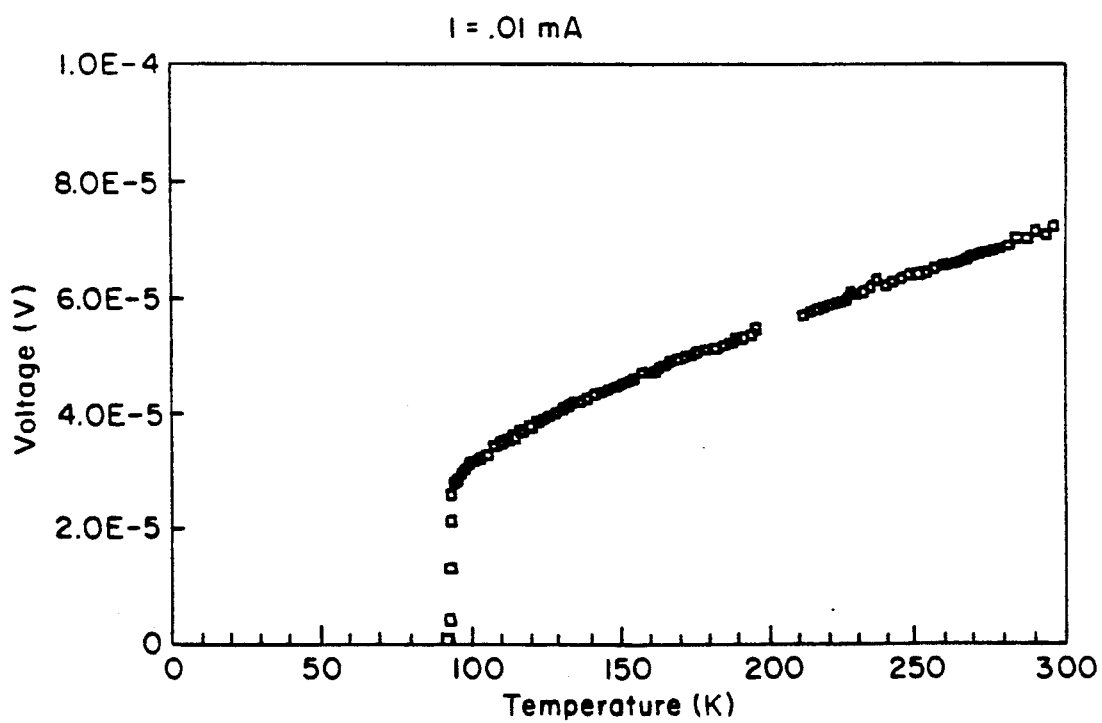
FIG. 13 is a graph showing the voltage vs. temperature behavior of a one micron thick film fired in moist $O_2$ at 850° C. for one hour on a (100) $SrTiO_3$ substrate.
Figure 12:
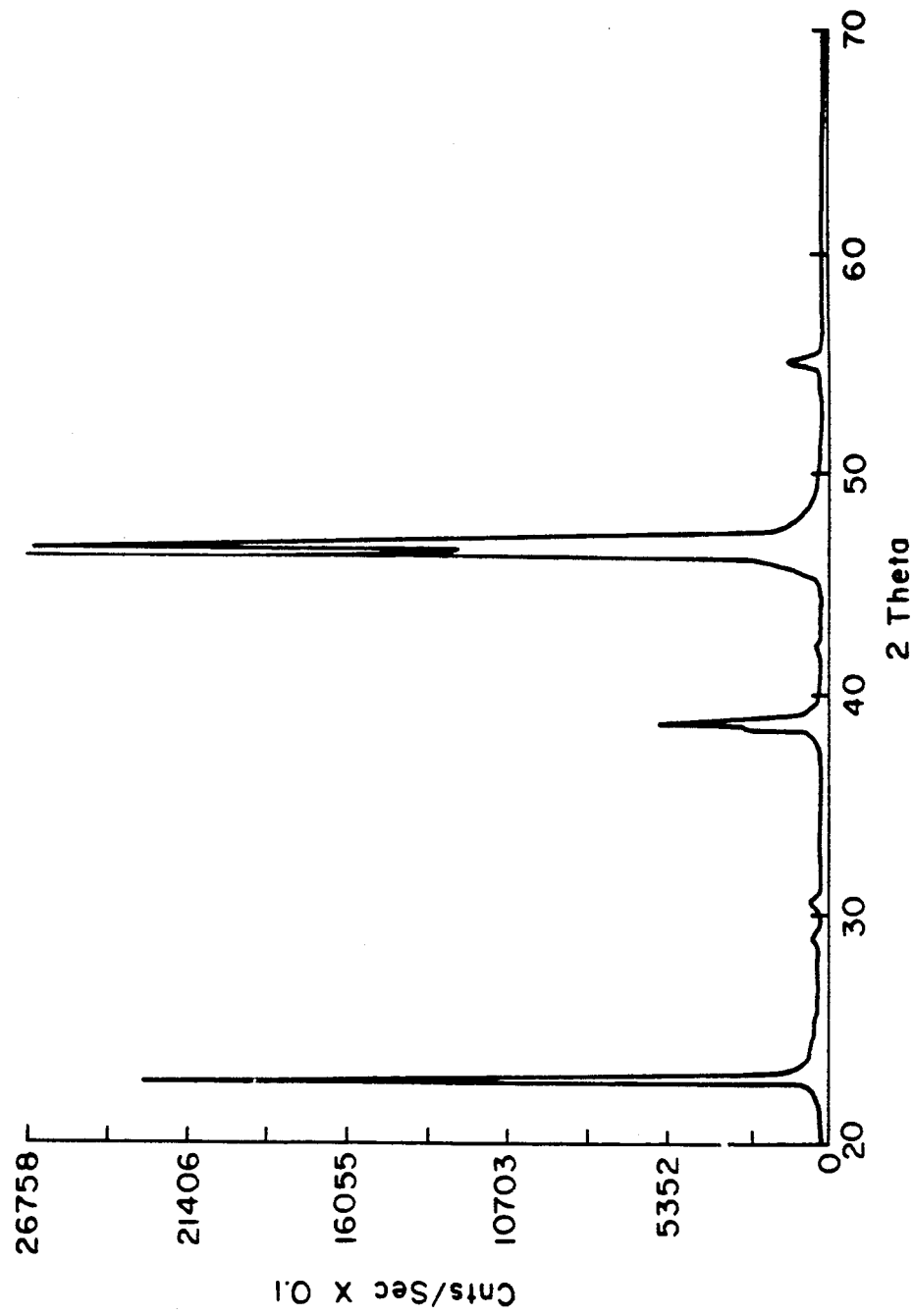
FIG. 12 is an x-ray powder pattern for a 0.3 micron-thick barium yttrium copper oxide film fired in moist (75° C. dew point) $N_2/3.5\%$ $O_2$ for one hour at 750° C. (100) $SrTiO_3$ substrate.

FIG. 9 shows a microstructure of aligned grains indicating registration of the barium yttrium copper oxide lattice with the substrate for a film fired in moist oxygen at 850° C. for 1 hour. Processing a superconductor film at a temperature lower than 850° C. in a reducing atmosphere can remove this "patchwork" texture by suppressing the formation of a-axis perpendicular to the substrate. The x-ray pole figure shown in FIG. 11 indicates an epitaxial relationship exists between the superconductor film and the substrate. The x-ray powder pattern shown in FIG. 12 shows only film and substrate reflections for 00n planes, indicating that the formation of a-axis perpendicular to the substrate has been suppressed and corroborating the microstructural evidence of FIG. 10.

This processing resulted in a film with very good electrical transport properties. The measured critical current density was in excess of $10^6 A/cm^2$ at 77 ° K. in zero applied field. The $T_c$ (zero resistance) equals 92° K. with a transition width of 2–3 ° K., as shown in FIG. 12.

What is claimed is:

1. A method for fabricating a textured superconducting oxide film comprising:
   preparing a metal-organic precursor solution containing cation constituents of the film in a stoichiometry nearly equal to the stoichiometry of the oxide film;
   selecting a substrate that is chemically non-inert with respect to the desired superconducting oxide;
   applying a coating of the precursor solution to said substrate;
   exposing the coating to a heat treatment comprising:
   a first heating at a first temperature in a first controlled atmosphere selected to decompose the precursor coating while avoiding the volatilization of a metal containing precursor constituent;
   a second heating at a second temperature in a second controlled atmosphere selected to create local compositional inhomogeneities in the coating;
   a third heating at a third temperature in a third controlled atmosphere selected to minimize the amount of transient liquid present and to form a compositionally homogeneous film; and
   a final heat treatment at a temperature in the range of 400° C. to 500° C. and in an oxygen atmosphere selected to insure that the film is fully oxygenated, thereby producing a textured superconducting oxide phase.

2. The method of claim 1 wherein the non-chemically inert substrate is selected from the group consisting of $SrTiO_3$, $LaAlO_3$, $LaGaO_3$, and $NdGaO_3$.

3. The method of claim 1 wherein said second and third atmosphere and temperature are chosen so that no liquid-contained phase field exists in a superconductor phase diagram between points corresponding to compositions of local coating inhomogeneities.

4. A method for fabricating a textured $Ba_2YCu_3O_{7-x}$ superconductor film on a (100) $SrTiO_3$ substrate comprising:
   mixing a metal trifluoroacetate precursor solution from powders of $BaCO_3$, $YCO_3 \cdot 3H_2O$ and $Cu(OH)_2CO_3$ in an approximately 2:1:3 ratio and reacting them with between 20% and 30%, 5.5–6.0M excess trifluoroacetic acid in methyl alcohol, followed by refluxing for approximately four hours to produce a solution substantially 0.94M based on copper content;
   applying a coating of the precursor solution to a polished (100) $SrTiO_3$ substrate with photoresist spinner at a speed in the range of approximately 3000–5000 rpm depending on substrate dimensions;
   heating the coating slowly, at a rate approximately in the range of 0.5°–1.0° C./min, in moist oxygen having a dew point approximately in the range of 20°–75° C. to a temperature approximately in the range 300°–500° C. to decompose the metal-containing precursor;
   heating the coating for approximately one hour in moist reducing nitrogen/oxygen gas mixture, having a composition approximately in the range of 0.1–5% $O_2$ at a temperature below 810° C. so as to create local inhomogeneities in the film and to minimize the amount of transient liquid present; and
   cooling the coating from said temperature range in dry oxygen with a hold for a time in excess of 2 hours at temperatures approximately in the range 400°–500° C. to fully oxygenate the film such that a textured superconducting oxide film is obtained.

5. A method for fabricating a textured $Ba_2YCu_3O_{7-x}$ superconductor film on a $BaZrO_3$ substrate comprising:
   mixing a metal trifluoroacetate precursor solution from powders of $BaCO_3$, $YCO_3 \cdot 3H_2O$ and $Cu(OH)_2CO_2$ in an approximately 2:1:3 ratio and reacting them with 5.5–6.0M excess trifluoroacetic acid in methyl alcohol, followed by refluxing for approximately ten hours to produce a viscous solution;
   applying a coating of the precursor to a polished $BaZrO_3$ substrate with a photoresist spinner at a speed approximately in the range of 3000–7500 rpm depending on substrate dimensions;
   heating the coating slowly, at a rate approximately in the range of 0.5°–1.0° C./min, in moist oxygen or nitrogen to a temperature in the range of 300°–500° C. to decompose the metal-containing precursor;
   heating the coating for a time approximately in the range of 0.25–4.00 hour in moist oxygen or nitrogen at a temperature approximately in the range of 650°–850° C. to create local compositional inhomogeneities in the coating;
   heating the coating at a rate approximately in the range of 5°–20° C./min to a temperature approximately in the range of 860°–950° C. for a time approximately in the range of 5–30 minutes to form a small amount of transient liquid;
   cooling the coating from said temperature range in flowing dry oxygen to a temperature approximately in the range of 400°–500° C. to fully oxygenate the film; and
   further cooling the coating to room temperature in static dry oxygen such that a textured superconducting film is obtained.

6. A method for fabricating a textured superconducting oxide film comprising:
   preparing a metalorganic precursor solution containing cation constituents of the film in a stoichiometry nearly equal to the stoichiometry of the oxide film;
   selecting a substrate that is chemically inert with respect to the desired superconducting oxide with a transient liquid phase;
   applying a coating of the precursor solution to said substrate;
   exposing the coating to a heat treatment comprising:
      at first heating at a first temperature in a first controlled atmosphere selected to decompose the precursor coating while avoiding the volatilization of a metal containing precursor constituent;
      a second heating at a second temperature in a second controlled atmosphere selected to create local compositional inhomogeneities in the coating;
      a third heating at a third temperature in a third controlled atmosphere selected to form a small amount of transient liquid sufficient to increasing the rate of grain growth and to form a compositionally homogeneous film; and
      a final heat treatment at a atmosphere in the range of 400° C. to 500° C. to insure that the film is fully oxygenated, thereby producing a textured superconducting oxide phase.

7. The method of claim 6 wherein the presence of the transient liquid phase is needed and the superconducting oxide is included in a phase diagram containing points where said second and third heating are further selected to correspond to a liquid phase between compositions characteristic of coating local inhomogeneities and where a phase having the same overall stoichiometry of the coating is not liquid under these conditions.

8. The method of claim 1 or 7 wherein the precursor solution contains an organic metal salt and is capable of forming a film having the overall stoichiometry of the superconducting oxide, but having small regions inhomogeneous in composition.

9. The method of claim 1 or 6 wherein the precursor solution is applied to a spinning substrate.

10. The method of claim 1 or 6 wherein the precursor solution is applied to the substrate by a method selected from the group consisting of dipping the substrate into the solution, spraying and printing the solution onto the substrate surface.

11. The method of claim 1 or 6 wherein the substrate is flat.

12. The method of claim 1 or 6 wherein the substrate is three-dimensional.

13. The method of claim 12 wherein the three dimensional substrate is a ribbon, wire or coil.

14. The method of claim 1 or 6 wherein the substrate is a single crystal lattice-matched to the superconducting oxide film.

15. The method of claim 1 or 6 wherein the substrate is not lattice-matched to the superconducting oxide film.

16. The method of claim 14 wherein the lattice-matched substrate is a lattice-matched substrate selected from the group consisting of (100) $SrTiO_3$, (001) $LaAlO_3$, (001) $LaGaO_3$, and (001) $NdGaO_3$.

17. The method of claim 15 wherein the non-lattice matched substrate is a non-lattice matched substrate selected from the group consisting of $BaZrO_3$, Ag-coated metal, ceramic or composite substrates, and barium aluminum spinel.

18. The method of claim 6 wherein the chemically inert substrate is $BaZrO_3$.

19. The method of claim 1 or 6 wherein multiple applications of precursor solution are made followed by intermediate bead treatments to produce a multilayer coating.

20. The method of claim 1 or 6 wherein the precursor solution wets the substrate well enough to coat the substrate.

21. The method of claim 1 or 6 wherein the cations are selected from the group consisting of La, Ba, Cu, Y, Sr, Ca and rare-earth ions Eu, Gd, Tb, Dy, Ho, Er, Tm, Yb, Pr, Ce, and Lu.

22. The method of claim 1 or 6 wherein the cation constituents are introduced as compounds selected from the group consisting of soluble carbonate, hydroxide, and acetate salts of La, Ba, Cu, Y, Sr, Ca, Eu, Gd, Th, Dy, Ho, Er, Tm, Yb, Pr, Ce, and Lu.

23. The method of claim 22 wherein the barium, yttrium, and copper containing salts are in a 2:1:3 ratio.

24. The method of claim 1 or 6 wherein the coating has the overall stoichiometry of the superconducting oxide, but has small regions inhomogeneous in composition.

25. The method of claim 6 wherein said second and third atmosphere and temperature are selected so that a phase field appears in a phase diagram which includes the superconducting oxide between points in the phase diagram which correspond to compositions of local inhomogeneities in the coating, while a point in the phase diagram corresponding to overall coating stoichiometry does not contain a liquid at said second and third atmosphere and temperature.

26. The method of claim 1 or 6 wherein the first controlled atmosphere is a moist gas, the second a moist reducing gas mixture and the third dry oxygen.

27. The method of claim 1 or 6 wherein said second temperature and said third temperature are the same.

28. The method of claim 1 or 6 wherein said second controlled atmosphere and said third controlled atmosphere are the same.

29. The method of claim 27 wherein said second controlled atmosphere said the third controlled atmosphere are the same.

* * * * *

UNITED STATES PATENT AND TRADEMARK OFFICE
CERTIFICATE OF CORRECTION

PATENT NO. : 5,231,074
DATED : July 27, 1993
INVENTOR(S) : Michael J. Cima, et al.

It is certified that error appears in the above-indentified patent and that said Letters Patent is hereby corrected as shown below:

Column 11, line 6: delete "liquid-contained" and insert therefor -- liquid-containing --;

Column 13, line 14: delete "bead" and insert therefor -- heat --;

Column 14, line 8: after "a" please insert -- liquid-containing --; and

Signed and Sealed this

Twenty-sixth Day of April, 1994

BRUCE LEHMAN

Attest:

Attesting Officer

Commissioner of Patents and Trademarks